United States Patent
Chien et al.

(10) Patent No.: US 7,341,949 B2
(45) Date of Patent: Mar. 11, 2008

(54) PROCESS FOR FORMING LEAD-FREE BUMP ON ELECTRONIC COMPONENT

(75) Inventors: Feng-Lung Chien, Taichung Hsien (TW); Huang-Chuan Chang, Taichung Hsien (TW); Chun-Sheng Ho, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 104 days.

(21) Appl. No.: 10/861,556

(22) Filed: Jun. 4, 2004

(65) Prior Publication Data

US 2005/0042872 A1 Feb. 24, 2005

(30) Foreign Application Priority Data

Aug. 21, 2003 (TW) ............................. 92122958 A

(51) Int. Cl.
*H01L 21/302* (2006.01)
(52) U.S. Cl. ......................... 438/689; 438/694
(58) Field of Classification Search ................ 438/689, 438/694, 613, 614
See application file for complete search history.

(56) References Cited

U.S. PATENT DOCUMENTS

| | | | |
|---|---|---|---|
| 5,405,577 A | 4/1995 | Seelig | 420/561 |
| 5,943,597 A * | 8/1999 | Kleffner et al. | 438/613 |
| 6,179,935 B1 | 1/2001 | Yamashita | 148/400 |
| 6,231,691 B1 | 5/2001 | Anderson | 148/800 |
| 6,413,851 B1 * | 7/2002 | Chow et al. | 438/613 |
| 6,426,281 B1 * | 7/2002 | Lin et al. | 438/612 |
| 6,440,836 B1 * | 8/2002 | Lu et al. | 438/612 |
| 6,501,185 B1 * | 12/2002 | Chow et al. | 257/780 |
| 6,583,039 B2 * | 6/2003 | Chen et al. | 438/612 |
| 6,617,237 B1 * | 9/2003 | Tong et al. | 438/613 |
| 6,638,847 B1 * | 10/2003 | Cheung et al. | 438/612 |
| 6,740,577 B2 * | 5/2004 | Jin et al. | 438/613 |
| 6,744,142 B2 * | 6/2004 | Liu et al. | 257/778 |
| 2003/0073036 A1 * | 4/2003 | Peng et al. | 430/311 |

FOREIGN PATENT DOCUMENTS

| | | |
|---|---|---|
| TW | 498009 | 8/2002 |
| TW | 527252 | 4/2003 |
| TW | 528638 | 4/2003 |

\* cited by examiner

*Primary Examiner*—Nadine Norton
*Assistant Examiner*—Lynette T. Umez-Eronini
(74) *Attorney, Agent, or Firm*—Peter F. Corless; Steven M. Jensen; Edwards Angell Palmer & Dodge LLP

(57) ABSTRACT

A process for forming a lead-free bump on an electronic component includes preparing the electronic component with at least one bond pad and a passivation layer formed thereon; forming an under bump metallurgy (UBM) structure on the passivation layer and the bond pad; applying a photoresist over the passivation layer, the photoresist having at least one opening corresponding to the bond pad; depositing a thick copper layer (about 1 to 10 μm thick) in the opening by electroplating; applying a copper-free or low-copper-content solder material on the copper layer; and performing a reflowing procedure under a suitable reflow temperature profile to allow copper ions to diffuse from the copper layer to the solder material so as to form the lead-free bump. This increases the copper content in the solder material but not raising the reflow temperature profile, thereby preventing deterioration of the photoresist due to over heat.

17 Claims, 8 Drawing Sheets

PROCESS FOR FORMING LEAD-FREE BUMP ON ELECTRONIC COMPONENT

FIELD OF THE INVENTION

The present invention relates to processes for forming copper-contained lead-free bumps on electronic components, and more particularly, to a process for forming a copper-contained lead-free bump, which can use a low reflow temperature profile.

BACKGROUND OF THE INVENTION

Flip-chip ball grid array (FCBGA) semiconductor package is incorporated with both the flip-chip and BGA structures, in which an active surface of at least one chip is electrically connected to a surface of a substrate via a plurality of conductive bumps, and a plurality of solder balls are formed on an opposite surface of the substrate to serve as input/output (I/O) connections. The FCBGA package does not require conventional bonding wires, and can be effectively reduced in size, as well as may reduce the resistance to improve the electrical performance thereof, thereby making the FCBGA package become a mainstream packaging technology for chips and electronic elements of the next generation.

In the flip-chip mounting technique, it is first to form a conductive trace layer on the active surface of the chip, wherein bond pads located at terminals of the conductive traces are used for external electrical connection. When the chip is to be electrically connected to the substrate, the above conductive bumps are formed on the bond pads of the chip, and then the active surface of the chip is turned upside down to be connected to a conductive trace layer on the substrate via the conductive bumps. The combined structure of the chip and substrate is subject to reflowing and underfilling processes, thus completing the flip-chip electrical connection.

The conductive bumps are conventionally made of tin (Sn)/lead (Pb). Since lead is toxic, lead-contained electronic products are becoming restricted in light of environmental protection, such that lead-free bumps are encouraged in development. Related prior arts include, for example, U.S. Pat. Nos. 6,231,691, 5,405,577 and 6,179,935, and Taiwanese Patent Nos. 528638, 527252 and 498009, which disclose the use of lead-free bumps such as pure Sn bumps, Sn—Ag bumps, Sn—Ag—Bi bumps, Sn—Ag—Cu bumps, or Sn—Ag—Cu—Bi bumps, among which Sn—Ag bumps and Sn—Ag—Cu bumps are primarily adopted in the industry.

However, Sn—Ag bumps do not contain copper (Cu) and thus has poorer structural strength than Sn—Ag—Cu bumps. During a stress reliability test in a thermal cycle, the test result shows that Sn—Ag bumps achieve lower reliability than Sn—Ag—Cu bumps, making Sn—Ag bumps less widely used than Sn—Ag—Cu bumps. On the contrary, fabrication of Sn—Ag—Cu bumps still renders a significant drawback that is difficult to be overcome. A conventional electroplating process has a restriction on metal ion exchange. Specifically, the electroplating process can be only used to form binary bumps but not ternary bumps such as Sn—Ag—Cu bumps. Accordingly, a conventional screen-printing process is usually employed to fabricate Sn—Ag—Cu bumps, in which however the content of copper would over raise a reflow temperature profile in a reflowing procedure, making the yield of the fabricated packages undesirably degraded. Therefore, the current lead-free bump technology is still not able to produce satisfactory lead-free bumps with good reliability and feasible fabrication processes.

FIGS. 1A to 1E show the procedural steps of the conventional screen-printing process for forming a Sn—Ag—Cu bump. Referring to FIG. 1A, a chip 10 is provided, and a passivation layer 11 is formed on an active surface 10a of the chip 10 with a bond pad 12 being exposed for external electrical connection. The passivation layer 11 is an insulating layer to provide a protection effect and a wetting function subsequent for a solder material. Referring to FIG. 1B, an under bump metallurgy (UBM) structure 14 is formed over the passivation layer 11 and covers the bond pad 12. The UBM structure 14 includes one or more metal layers such as chromium (Cr), nickel (Ni), titanium (Ti) and so on to increase wettability of the solder material, increase adhesion between the chip and the solder material, prevent oxidation, and serve as a metal diffusion barrier. Referring to FIG. 1C, a photoresist 16 is formed on the UBM structure 14 and subject to exposing and developing procedures to cover the position corresponding to the bond pad 12. Referring to FIG. 1D, an etching procedure is performed to remove the part of the UBM structure 14 not covering the bond pad 12 and the photoresist 16. Then referring to FIG. 1E, a dry film 17 is applied over the passivation layer 11 and has an opening to define a location for filling a lead-free solder material. Referring to FIG. 1F, a liquid Sn—Ag—Cu solder material 18 is filled in the opening of the dry film 17. Finally referring to FIG. 1G, when two reflowing procedures are carried out, the dry film 17 is removed, and a ball-shaped lead-free bump 19 is formed by surface tension generated during melting of the Sn—Ag—Cu solder material 18 in the reflowing procedures.

As discussed above, Sn—Ag bumps and Sn—Ag—Cu bumps, which are relatively more commonly used among the various lead-free bumps, both have undesirable drawbacks. Sn—Ag bumps not containing copper are weaker in structural strength and achieve lower reliability in the stress reliability test as compared to Sn—Ag—Cu bumps. On the other hand, Sn—Ag—Cu bumps containing copper lead to rise of the reflow temperature profile depending on the content of copper. This is because addition of copper would increase a eutectic point of the lead-free solder material. The more copper is added, the more the eutectic point rises. For example, in the case of the copper content more than 1%, the eutectic point of the lead-free solder material is increased to about 300° C.; on the contrary, a eutectic point of Sn/Pb 63/37 solder material is only about 183° C. As a result, during the first reflowing procedure, an operating temperature of the Sn—Ag—Cu solder material may be increased up to 300° C., and the dry film cannot sustain such a high temperature and becomes altered or deteriorated to be difficult for complete removal. The remaining residues of the dry film on the chip would degrade the adhesion reliability for example between an underfill material and the active surface of the chip.

Moreover, for a thermally liable material such as a laminate substrate that cannot tolerate a high temperature, the reflow temperature of 300° C. is so high to cause thermal stress generated between the chip and the substrate, which may lead to problems such as deformation or delamination of the chip and the substrate, deterioration of the electrical performance and cracking of the chip, and degradation of the yield.

Therefore, the problem to be solved here is to provide a process for forming a copper-contained lead-free bump on an electronic component under an appropriate reflow temperature profile.

SUMMARY OF THE INVENTION

A primary objective of the invention is to provide a process for forming a 1 copper-contained lead-free bump on an electronic component, by which a reflow temperature profile during fabrication of the copper-contained lead-free bump would not be extraordinarily high.

Another objective of the invention is to provide a process for forming a copper-contained lead-free bump on an electronic component, by which a Sn—Ag—Cu bump is fabricated by reflowing a copper layer and a binary bump (such as Sn—Ag bump) without having to use a Sn—Ag—Cu solder material.

A further objective of the invention is to provide a process for forming a copper-contained lead-free bump on an electronic component, which can prevent the electronic component from warpage, delamination or cracking and provide good mechanical strength for the copper-contained lead-free bump.

In order to achieve the above and other objectives, the present invention proposes a process for forming a copper-contained lead-free bump on an electronic component, comprising the steps of: providing the electronic component (such as chip or substrate) with a passivation layer and at least one bond pad formed on a surface of the electronic component, the bond pad being exposed from the passivation layer; forming an under bump metallurgy (UBM) structure on the passivation layer and the bond pad; applying a photoresist on the UBM structure, the photoresist having at least one opening corresponding to the bond pad; depositing a thick copper layer in the opening of the photoresist; applying a binary Sn—Ag solder material or a ternary low-copper-content Sn—Ag—Cu solder material on the copper layer and in the opening of the photoresist; removing the photoresist; and performing a reflowing procedure for the copper layer and the solder material to form a lead-free Sn—Ag—Cu bump.

Due to the property that copper ions start to diffuse at a specific range of temperature, during reflowing at a suitable reflow temperature (220-260° C.), copper ions would diffuse from the copper layer into the solder layer to thereby increase the copper content of the solder layer, making the fabricated bump have preferable mechanical strength and reliability.

Rather than using the conventional high-copper-content solder material that raises the reflow temperature profile in the prior art, the present invention separately forms the copper layer and the Sn—Ag solder material and allows copper ions to diffuse from the copper layer into the Sn—Ag solder material during reflowing so as to fabricate the Sn—Ag—Cu bump. The reflow temperature profile can be kept at 220-260° C. in the present invention using a copper-free binary Sn—Ag solder material or a ternary low-copper-content Sn—Ag—Cu solder material, unlike the solder material in the prior art having copper more than 1% that raises the reflow temperature profile to 300° C. Therefore, in the present invention, the photoresist would not be deteriorated due to over heat and can be completely removed without remaining on the chip or substrate, and also the chip or substrate can be protected against delamination, warpage or cracking caused by an extraordinarily high temperature.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

FIGS. 2A-2G show the procedural steps of a process for forming a copper-contained lead-free bump on an electronic component (such as chip) according to a first preferred embodiment of the present invention.

Figure 1A:
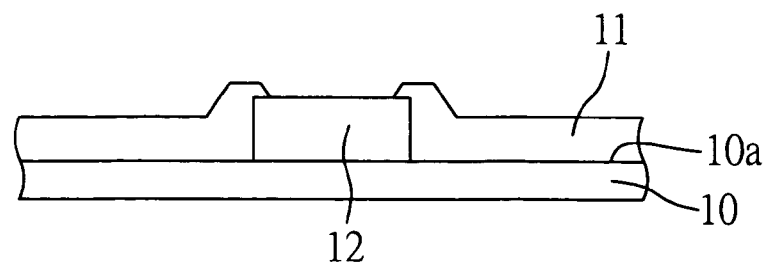
FIGS. 1A-1G (PRIOR ART) are schematic diagrams showing the procedural steps of a conventional process for forming a bump on a chip.
Figure 1B:
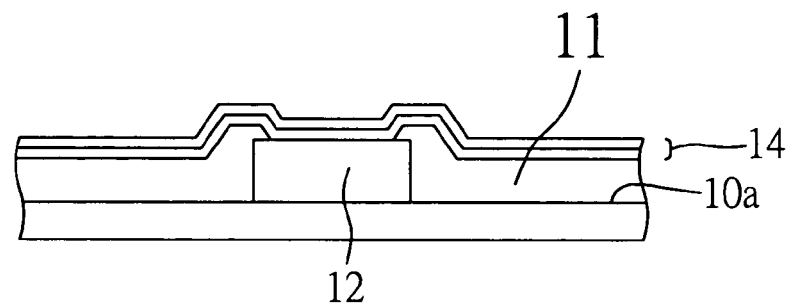
Figure 1C:
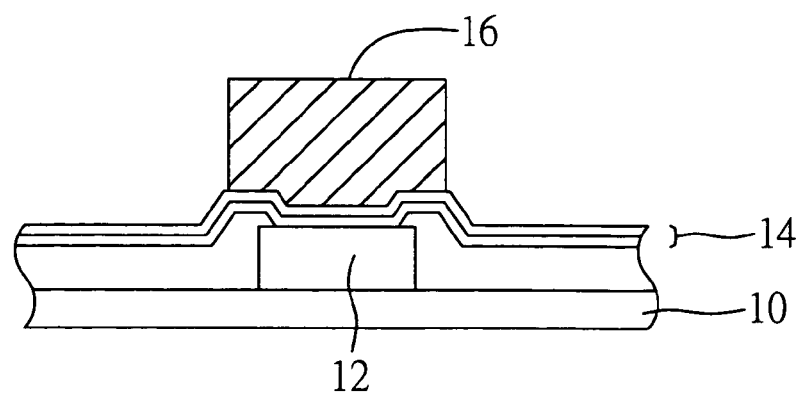
Figure 1D:
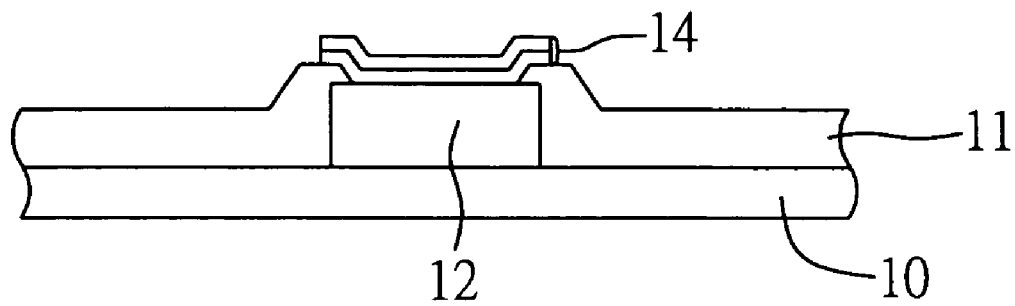
Figure 1E:
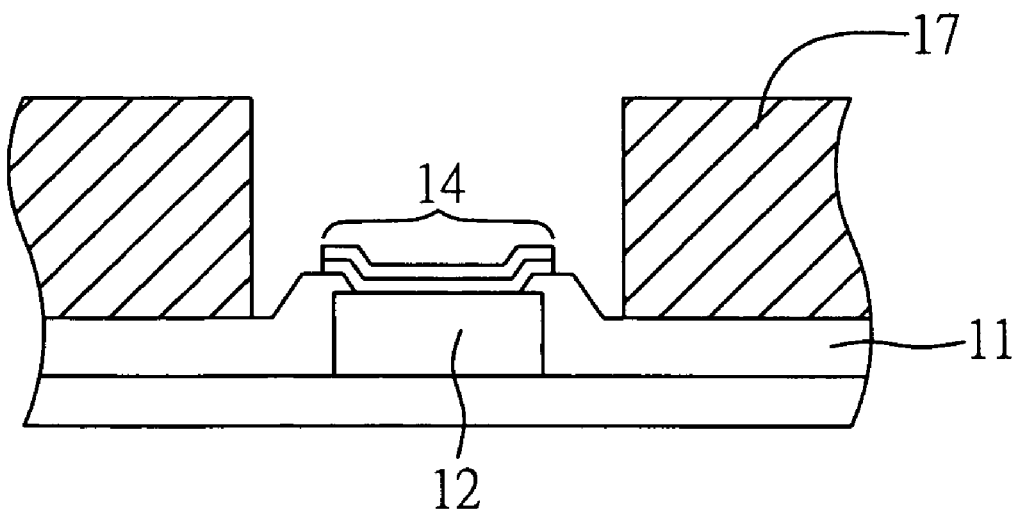
Figure 1F:
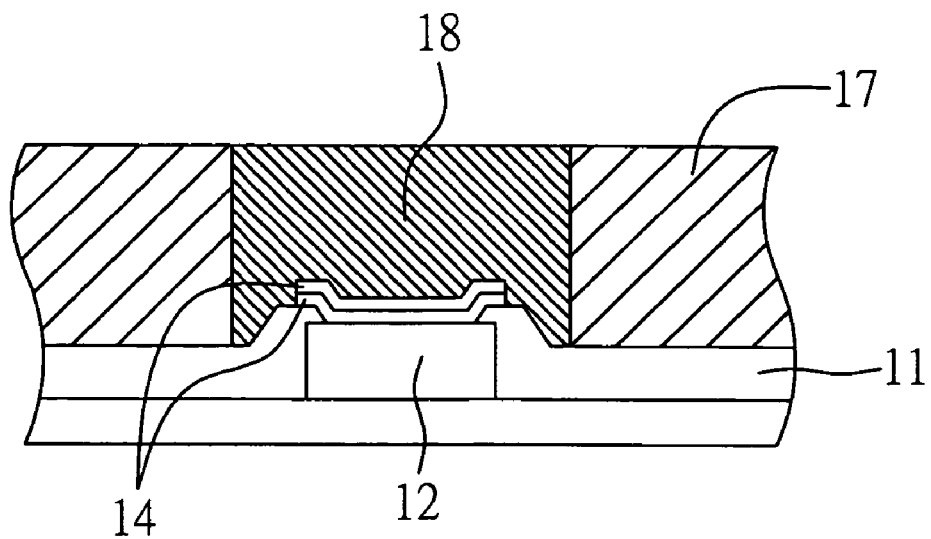
Figure 1G:
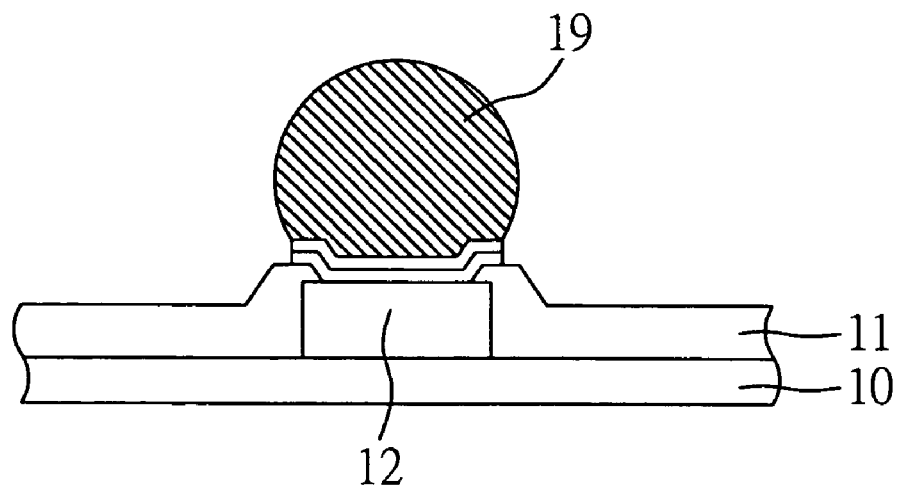
Figure 2A:
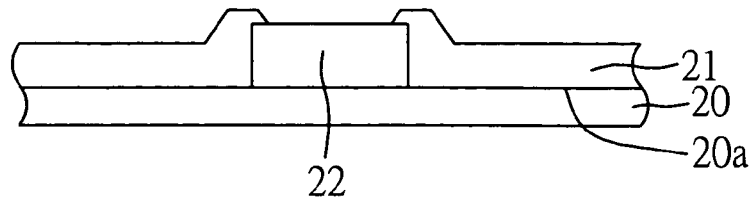
FIGS. 2A-2G are schematic diagrams showing the procedural steps of a process for forming a copper-contained lead-free bump on an electronic component according to a first preferred embodiment of the present invention.

First, referring to FIG. 2A, a chip 20 is prepared having an active surface 20a on which a conductive trace layer including at least one bond pad 22 is formed. A passivation layer 21 is deposited on the conductive trace layer, with the bond pad 22 being exposed from the passivation layer 21. The passivation layer 21 is used to protect the conductive traces against external moisture and contaminants and electrically isolate the conductive traces from the outside.

Figure 2B:
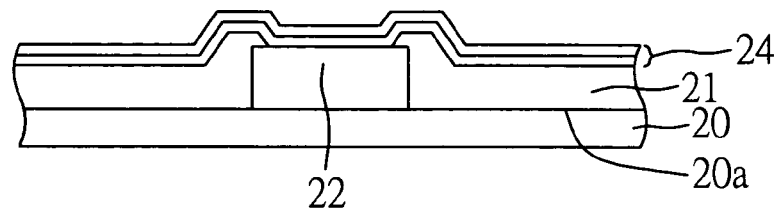

Referring to FIG. 2B, an under bump metallurgy (UBM) structure 24 is formed over the passivation layer 21 and covers the bond pad 22. The UBM structure 24 comprises one or more metal layers that are usually made of aluminum-nickel/vanadium-copper (Al—Ni/V—Cu) alloy or a combination thereof, or can be selected from titanium (Ti), Ti—W (titanium-tungsten) alloy, Ni, Cr—Cu (chromium-copper) alloy, Ni—V alloy and Ni—Au (nickel-gold) alloy or a combination thereof. The UBM structure 24 may further comprise a barrier layer containing Ni or V. The material and number of the metal layers of the UBM structure 24 are not particularly limited in the present invention.

Figure 2C:
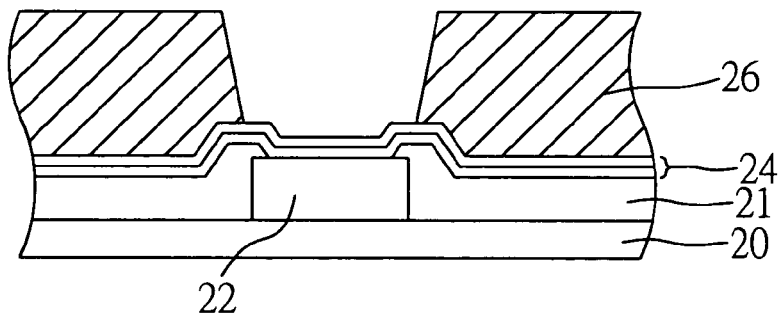

Referring to FIG. 2C, a photoresist 26 such as dry film or liquid photoresist is applied over the UBM structure 24 and subject to exposing and development procedures to form at least one opening through the photoresist 26 and corresponding in position to the bond pad 22.

Figure 2D:
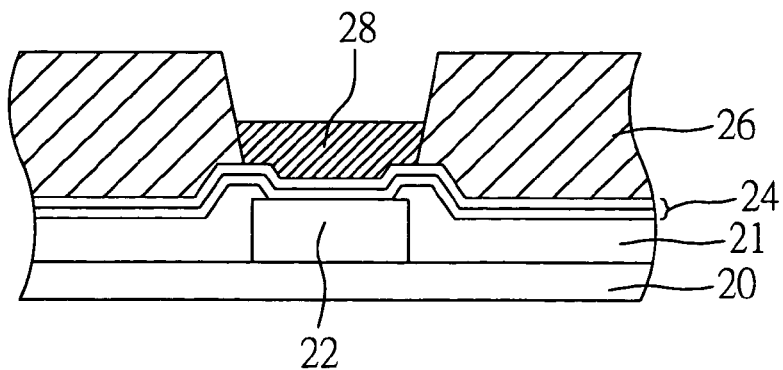

Referring to FIG. 2D, an electroplating procedure is performed to deposit a thick copper layer 28 in the opening of the photoresist 26. The copper layer 28 is about 1 to 10 µm thick, preferably 5 µm.

Figure 2E:
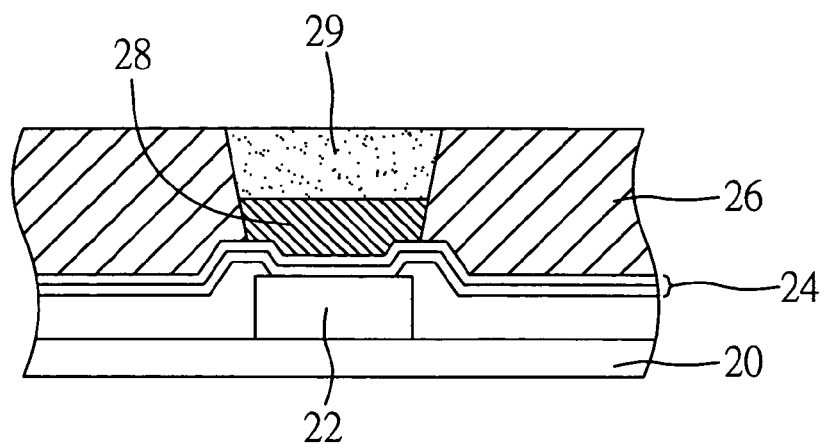

Then, referring to FIG. 2E, an electroplating or screen-printing technique is adopted to fill a binary Sn—Ag solder material 29 into the opening of the photoresist 26, making copper layer 28 covered by the Sn—Ag solder material 29. The binary solder material 29 mainly comprises tin (Sn) and can be added with other components such as silver (Ag) and bismuth (Bi); or may further comprise a small amount (not exceeding 0.5%) of copper.

Figure 2F:
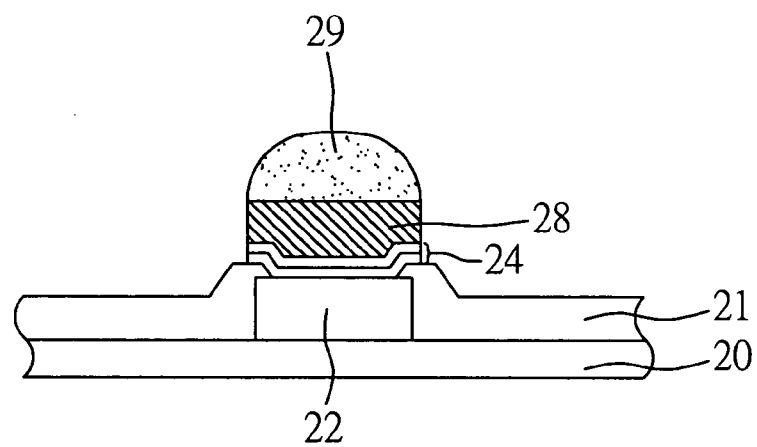

Referring to FIG. 2F, a first reflowing procedure is carried out to melt the Sn—Ag solder material 29 under a reflow temperature of 220-260° C. Then, the photoresist 26 is removed by etching, and further a part of the UBM structure 24 not covering the bond pad 22 is removed using the Sn—Ag solder material 29 as a mask.

Figure 2G:
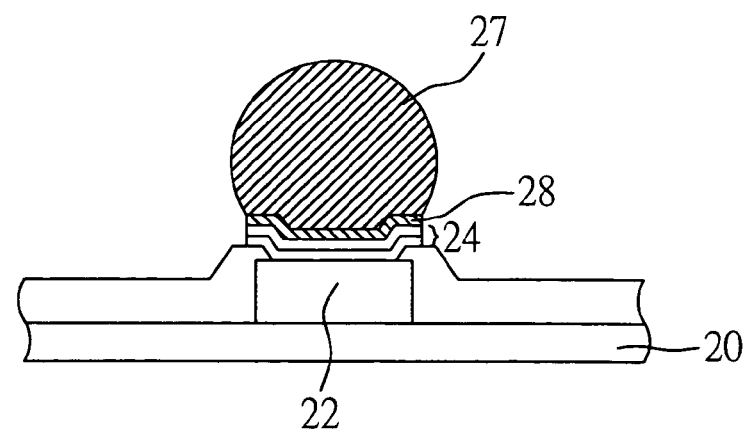

Lastly, referring to FIG. 2G, a second reflowing procedure is performed for the Sn—Ag solder material 29 and the copper layer 28 under a reflow temperature of at least 220° C., preferably 220-260° C., to form a ball-shaped bump 27 by virtue of cohesion between solder materials. Since copper ions start to diffuse at a temperature of 220-260° C., during the second reflowing procedure, copper ions in the copper layer 28 would diffuse into the Sn—Ag solder material 29 to increase the content of copper in the ball-shaped bump 27, such that the structural strength and reliability of the bump 27 can be improved thereby solving the prior-art problem.

Besides the chip, the present invention is also applicable to a substrate for forming a copper-rich bump on a conductive trace layer of the substrate.

It is a characteristic feature of the method for forming a copper-contained bump on a chip or substrate according to the present invention that, a thick copper layer is deposited before applying a solder material, and by virtue of the property of copper ions that start to diffuse at a specific range of temperature, during reflowing, copper ions of the copper layer are allowed to diffuse into the solder material, such that the copper content in the solder material can be increased without using an extraordinarily high reflow temperature, and thus the fabricated ball-shaped bump would have preferable structural strength and reliability.

Moreover, since the copper content in the solder material is raised by diffusion of copper ions in the copper layer into the solder material at the reflow temperature, this reflow temperature can be substantially kept constant and would not be altered according to the copper content in the solder material. The reflow temperature of merely about 220-260° C. is much lower than that (about 300° C.) for the conventional lead-free solder material having more than 1% copper. This thereby protects the chip or substrate from delamination, warpage or cracking due to the excessively high reflow temperature, while maintaining the electrical performance of the chip or substrate intact.

Second Preferred Embodiment

FIGS. 3A-3H show the procedural steps of the process for forming a copper-contained lead-free bump on an electronic component according to a second preferred embodiment of the present invention. The second embodiment differs from the above first embodiment in the aspects detailed below.

Figure 3A:
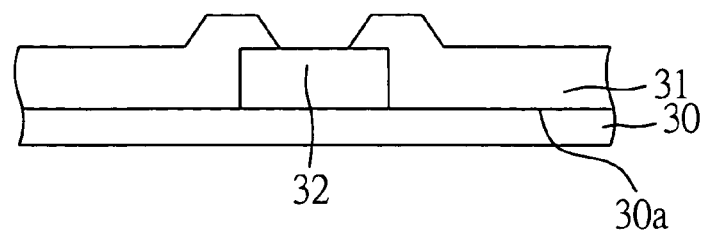
FIGS. 3A-3H are schematic diagrams showing the procedural steps of the process for forming a copper-contained lead-free bump on an electronic component according to a second preferred embodiment of the present invention.
Figure 3B:
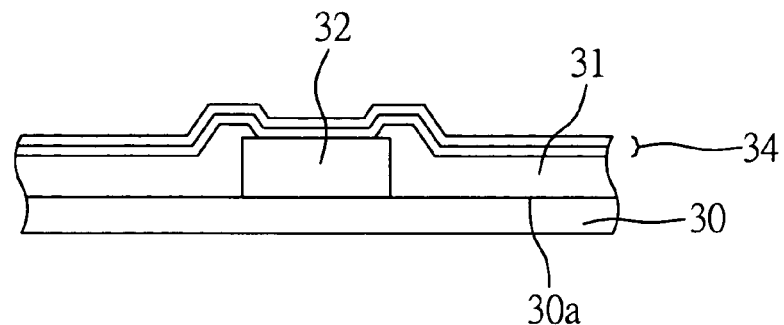
Figure 3C:
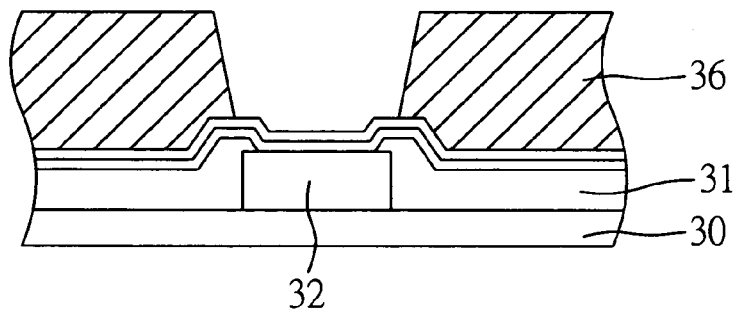
Figure 3D:
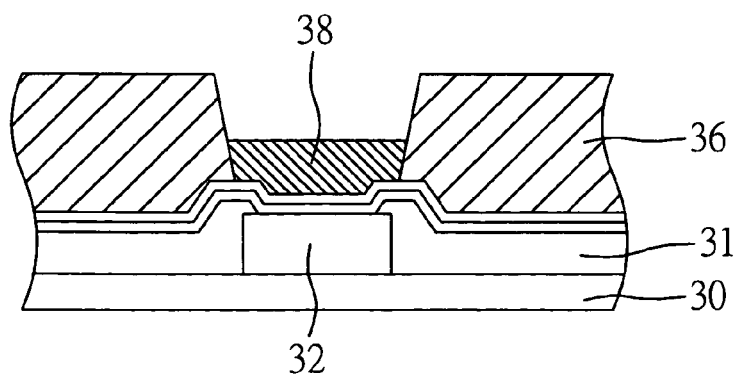
Figure 3E:
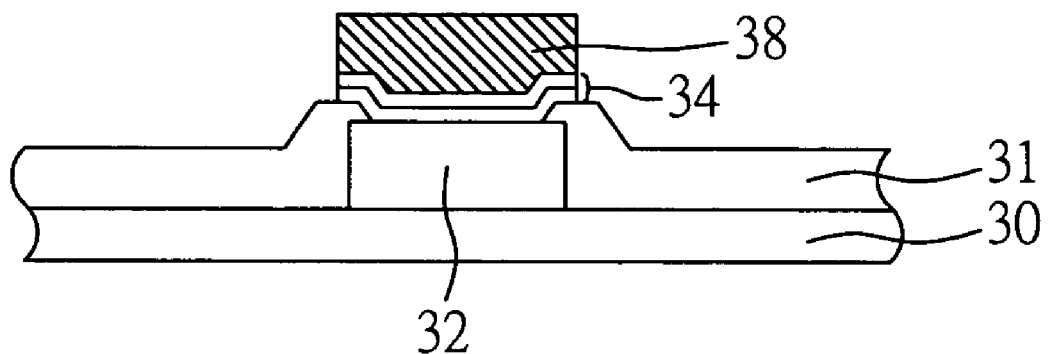

Referring to FIGS. 3A-3D, at least one bond pad 32 is formed on a chip 30, and a passivation layer 31 is applied over a surface 30a of the chip 30, with the bond pad 32 being exposed from the passivation layer 31. A UBM structure 34 is formed on the bond pad 32 and the passivation layer 31. A first photoresist 36 such as dry film is applied over the UBM structure 34 and has at least one opening corresponding in position to the bond pad 32. After a thick copper layer 38 is deposited by electroplating in the opening of the first photoresist 36, the first photoresist 36 and a part of the UBM structure 34 not covering the bond pad 32 are removed as shown in FIG. 3E, to expose the passivation layer 31 and the copper layer 38 having a thickness of 1 to 10 μm.

Figure 3F:
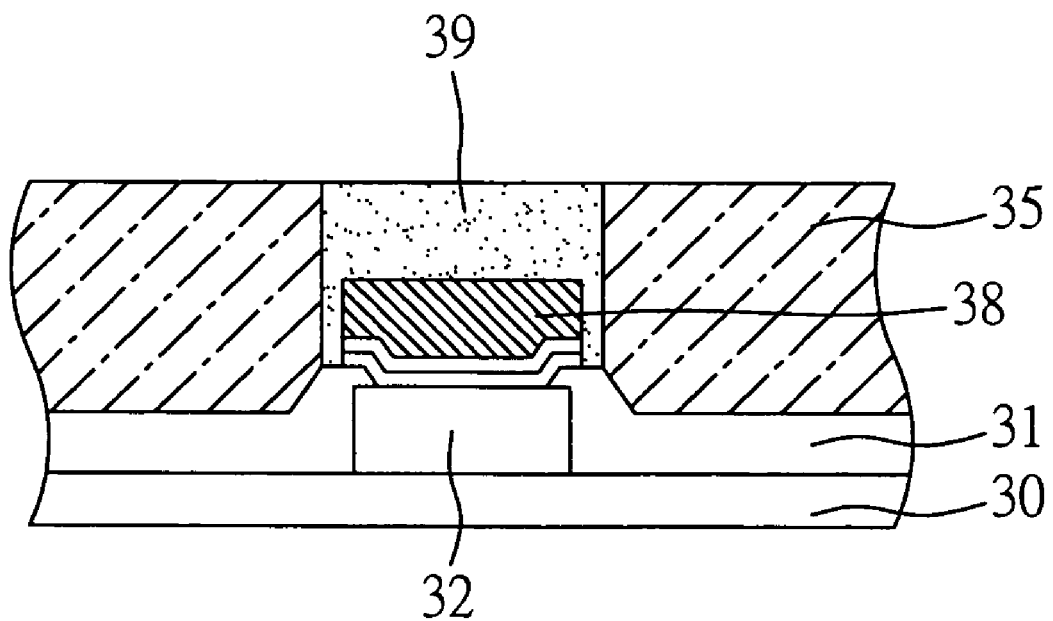

Referring to FIG. 3F, a second photoresist 35 is formed on the passivation layer 31 and has at least one opening to receive the copper layer 38 therein. A screen-printing technique is utilized to fill a binary Sn—Ag solder material 39 into the opening of the second photoresist 35, making the copper layer 38 (including its peripheral side and top) covered by the Sn—Ag solder material 39. The binary solder material 39 mainly comprises tin (Sn) and can be added with other components such as silver (Ag) and bismuth (Bi); or may further comprise a small amount (not exceeding 0.5%) of copper.

Figure 3G:
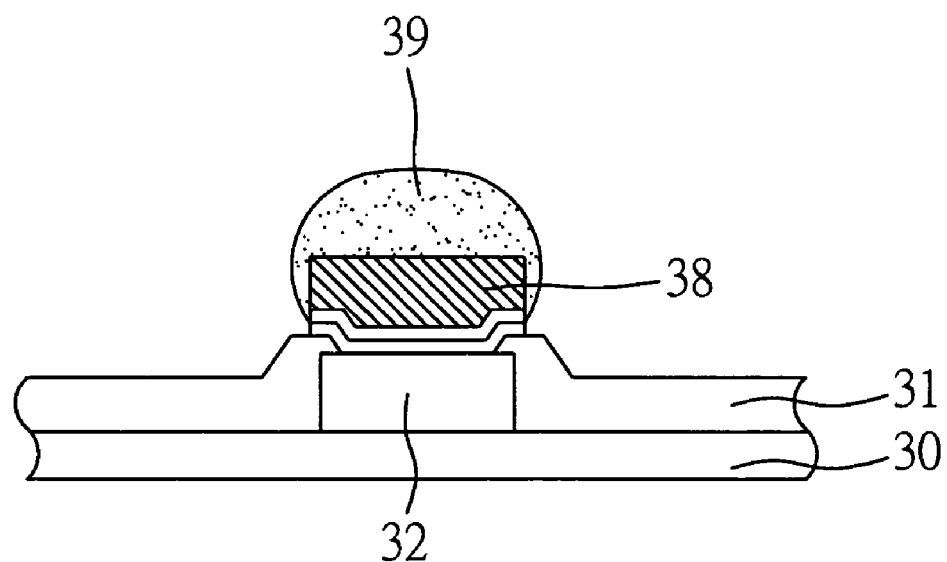
Figure 3H:
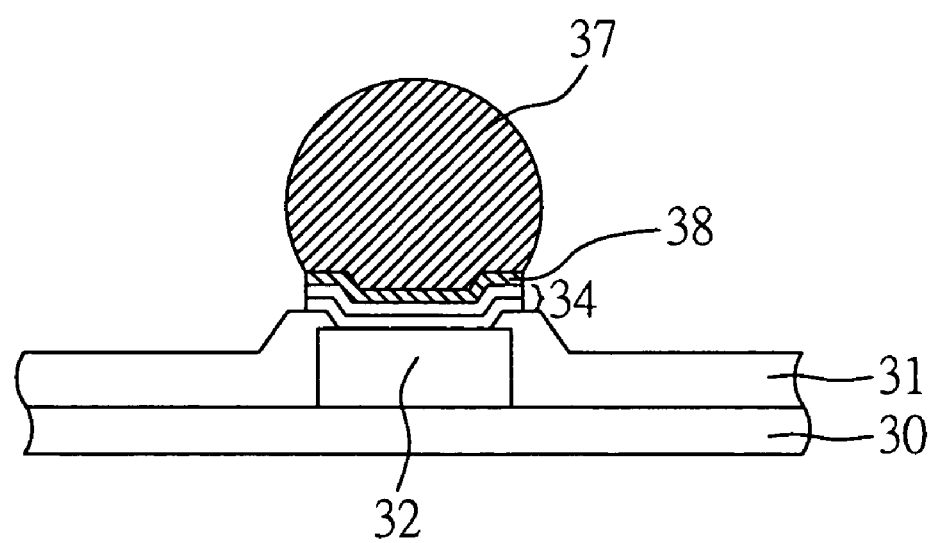

Referring to FIG. 3G, a first reflowing procedure is performed to melt the Sn—Ag solder material 39, and then the second photoresist 35 such as dry film is removed.

Lastly, a second reflowing procedure is carried out. By virtue of cohesion and ion diffusion between the Sn—Ag solder material 39 and the copper layer 38 in which copper ions diffuse from the copper layer 38 to the Sn—Ag solder material 39, a ternary Sn—Ag—Cu bump 37 shown in FIG. 3H can be formed. In this step, a reflow temperature is at least about 220° C., preferably 220-260° C., under which temperature copper ions start to diffuse. The present invention utilizes this diffusion property of copper ions to increase the copper content in the bump 37 and thus improve the structural strength and reliability of the bump 37. As a result, the present invention does not require the conventional ternary Sn—Ag—Cu solder material (having more than 1% copper) and thereby can reduce the reflow temperature, making the photoresist or dry film not altered or deteriorated due to an extraordinarily high temperature or over heat, such that the photoresist or dry film can be completely removed.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A process for forming a conductive bump on an electronic component, the process comprising the steps of:
   providing the electronic component with a passivation layer and at least one bond pad formed on a surface of the electronic component, the bond pad being exposed from the passivation layer;
   forming an under bump metallurgy (UBM) structure on the passivation layer and the bond pad;
   applying a photoresist on the UBM structure, the photoresist having at least one opening corresponding to the bond pad;
   depositing a thick copper layer in the opening of the photoresist;
   after removing the photoresist and a part of the UBM structure free of covering the bond pad,
   applying on the passivation layer another photoresist which has at least one opening for receiving the copper layer therein;
   applying a solder material on the copper layer and in the opening of the photoresist; and
   performing a reflowing procedure for mixing the copper layer and the solder material to form the conductive bump, wherein copper ions diffuse from the copper layer into the solder material.

2. The process of claim 1, wherein the electronic component is a chip.

3. The process of claim 1, wherein the electronic component is a substrate.

4. The process of claim 1, wherein the UBM structure is made of aluminum—nickel/vanadium-copper (Al—Ni/V—Cu) alloy.

5. The process of claim 1, wherein the UBM structure comprises a baffler layer containing nickel.

6. The process of claim 1, wherein the UBM structure comprises a baffler layer containing vanadium.

7. The process of claim 1, wherein the photoresist is a dry film.

8. The process of claim 1, wherein the photoresist is a liquid photoresist.

9. The process of claim 1, wherein the copper layer is 1 to 10 μm thick.

10. The process of claim 1, wherein the copper layer is deposited by an electroplating technique.

11. The process of claim 1, wherein the solder material comprises tin (Sn).

12. The process of claim 11, wherein the solder material is a binary tin-silver (Sn—Ag) solder material.

13. The process of claim 11, wherein the solder material is a binary tin-bismuth (Sn—Bi) solder material.

14. The process of claim 11, wherein the solder material is a ternary tin-silver-copper (Sn—Ag—Cu) solder material with the copper content less than or equal to 0.5%.

15. The process of claim 1, wherein the solder material is applied by an electroplating technique.

16. The process of claim 1, wherein the solder material is applied by a screen-printing technique.

17. The process of claim 1, wherein a reflow temperature during the reflowing procedure is between 220° C. to 260° C.

* * * * *